United States Patent
Anand et al.

(10) Patent No.: US 6,253,362 B1
(45) Date of Patent: Jun. 26, 2001

(54) METHOD OF DESIGNING DUMMY WIRING

(75) Inventors: Minakshisundaran Balasubramanian Anand; Hiroshi Ohtani, both of Yokohama (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/175,582

(22) Filed: Oct. 20, 1998

(30) Foreign Application Priority Data

Oct. 22, 1997 (JP) .................................................. 9-289762

(51) Int. Cl.[7] ...................................................... G06F 17/50
(52) U.S. Cl. .................................................................. 716/8
(58) Field of Search ..................................................... 716/8

(56) References Cited

U.S. PATENT DOCUMENTS 6,067,409 * 5/2000 Scepanovic .............................. 716/8

FOREIGN PATENT DOCUMENTS

| 2-240946 | 9/1990 | (JP) . |
| 5-275531 | 10/1993 | (JP) . |
| 8-6231 | 1/1996 | (JP) . |

* cited by examiner

*Primary Examiner*—Matthew Smith
*Assistant Examiner*—Thuan Do
(74) *Attorney, Agent, or Firm*—Finnegan, Henderson, Farabow, Garrett & Dunner, L.L.P.

(57) ABSTRACT

Wiring of a non-uniform density is laid out on a chip. Then, the chip is virtually divided into a plurality of sub chips. The wiring density of each sub chip is obtained to obtain the density distribution function of wiring. After that, an index indicative of variations in the density of wiring is obtained on the basis of the density distribution function, thereby determining whether or not the index falls within an allowable range. If the index is out of the allowable range, the density distribution function is repeatedly updated until the index falls within the allowable range. Dummy wiring is provided on a region obtained by subtracting a region corresponding to the initial density distribution function from a region corresponding to the last density distribution function.

7 Claims, 4 Drawing Sheets

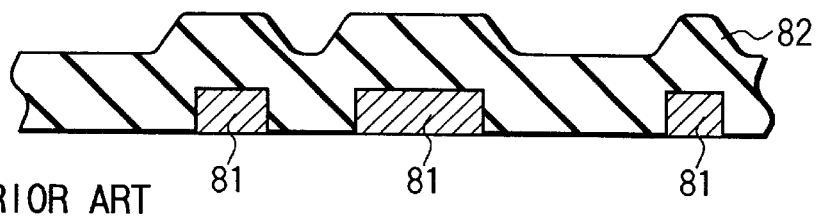
FIG. 7 PRIOR ART
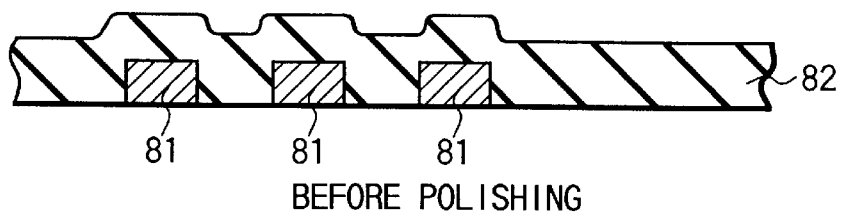
FIG. 8A          BEFORE POLISHING
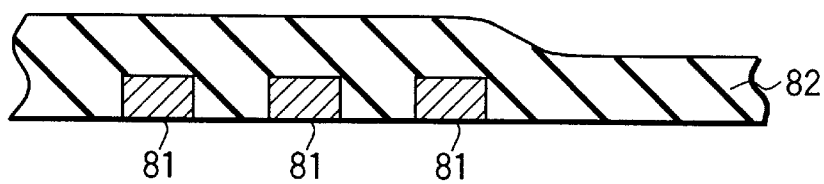
FIG. 8B PRIOR ART          AFTER POLISHING
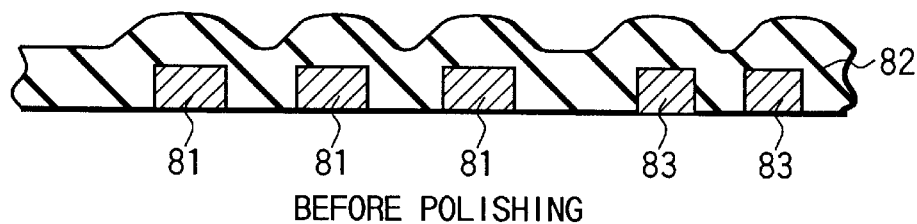
FIG. 9A          BEFORE POLISHING
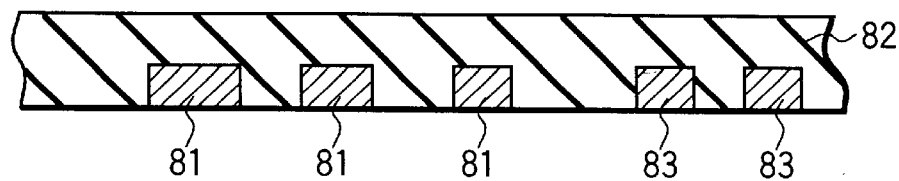
FIG. 9B PRIOR ART          AFTER POLISHING

METHOD OF DESIGNING DUMMY WIRING

BACKGROUND OF THE INVENTION

This invention relates to a method of designing dummy wiring in a semiconductor device, and more particularly to a method of designing dummy wiring used to improve the flatness of an insulating film deposited on a region in which underlayer wiring exists.

In the manufacture of Ultra Large Scale Integrated (ULSI) Circuits, it is well known that the series of process steps of forming a deposit film such as an insulating film on a semiconductor substrate, and forming a fine pattern such as a wiring pattern on the deposit film are repeated.

The process of forming a fine pattern includes two steps—a photolithography step and an etching step.

In the photolithography step, a to-be-patterned film such as a metal film is coated with a photoresist (a coating step), and then a mask is provided on the photoresist and predetermined regions of the photoresist are radiated with light (an exposure step).

After the exposure step, the photoresist is processed using a developer as in the case of the development of a photograph. Those regions of the photoresist which are radiated with light are chemically changed. Those chemically changed regions can be removed using the developer.

Thus, a photoresist pattern which is the same pattern as the mask pattern is formed.

In the etching step, the resultant photoresist pattern is used as a mask, thereby etching a film, which is usually patterned by RIE (Reactive Ion Etching), into the same pattern as the photoresist pattern.

However, the method of forming a fine pattern using photolithography is more and more complicated and difficult to carry out, for the following reasons:

(1) The size of the pattern to be formed is decreasing. The minimum size of the presently manufactured ULSIs is less than 0.5 μm.

(2) In accordance with the increase of the degree of integration, i.e. the increase of the number of elements such as transistors integrated in a single chip, the required length of the entire wiring used to connect the elements is increasing rapidly. This means that the number of layers for multi-layer wiring must be increased to avoid an increase in chip size.

The conventional multi-layer wiring is formed as below.

First, a first wire layer is formed using the above-mentioned fine pattern forming method.

Then, an interlayer insulating film is formed on the first wire layer, and a via hole is formed in the interlayer insulating film (a first step).

Subsequently, a plug is formed in the via hole, and a second wire layer to be connected to the first wire layer by means of the plug is formed using the fine pattern forming method (a second step).

After that, the first and second steps are repeated, thereby forming multi-layer wiring of a predetermined number of layers.

The above-described multi-layer wiring formation method has the following problems:

As is shown in FIG. 7, the multi-layer wiring forming method includes the step of forming an interlayer insulating film 82 which covers wiring 81. As is evident from the figure, the interlayer insulating film 82 has an uneven surface which reflects the pattern of the underlayer wiring 81.

Where the interlayer insulating film 82 with the uneven surface is coated with a resist and then subjected to photolithography, light to be used for exposure must have a greater focal depth than in the case of an interlayer insulating film of a flat surface.

On the other hand, it is necessary, in photolithography, to enhance the resolution of exposing light using short wavelength light in order to selectively expose fine regions. However, the greater the resolution, the shallower the focal depth. Accordingly, it is difficult to form a desired fine pattern on the interlayer insulating film 82 with the uneven surface.

This problem can be solved by flattening the surface of the interlayer insulating film. Among the flattening techniques, CMP (Chemical Mechanical Polishing) has been being used widely since it can flatten the entire wafer with high precision.

CMP, however, will cause a "dishing" phenomenon which is a well-known problem. This phenomenon occurs due to variations in the density of wiring 81 located under the interlayer insulating film 82. As is shown in FIGS. 8A and 8B, the amount of polishing is greater in a region of a low wiring density in which no wiring 81 exist, than in the other region of a high wiring density in which the wiring 81 exists. As a result, the level of the surface of that portion of the interlayer insulating film 82, which is provided on the region of the low wiring density, is lower than the level of the surface of that portion of the film 82 which is provided on the are of the high wiring density.

Thus, that part of the film 82 which has a high wiring density underneath shows a high degree of flatness but the entire film 82 is not completely flat. This is especially disadvantageous in the case of a logic device in which wires are provided at random on the entire chip, i.e. the range of variations in wiring density may be large.

To prevent occurrence of dishing, it suffices if dummy wiring 83 is provided on a region in which dishing will occur, thereby minimizing the range of variations in wiring density, as is shown in FIGS. 9A and 9B.

In this case, it is necessary to precisely determine the region in which the dummy wiring 83 is formed. In the conventional method of determining the region for the dummy wiring 83, first, the layout of the entire chip is inspected, then dummy wiring is actually provided on the region of the chip in which dishing may occur, and CMP is performed to determine whether or not dishing occurs in the region. The determination of the region in which dishing may occur, the formation of the dummy wiring, and CMP are repeated until dishing does not occur any more.

However, since, the above determinations are performed manually, the time required is very large.

BRIEF SUMMARY OF THE INVENTION

It is the object of the invention to provide a dummy wiring designing method for automatically determining the region in which dummy wiring is formed.

To attain the object, there is provided a method of designing dummy wiring comprising: the first step of laying out a pattern of a non-uniform density on a layout region; the second step of dividing the layout region into a plurality of sub layout regions, each of the sub layout regions having a size which is ¼ or less of the size of the layout region; the third step of sequentially scanning the sub layout regions, obtaining the pattern density of the scanned region of each sub layout region, thereby obtaining a density distribution function concerning the pattern; the fourth step of obtaining an index indicative of variations in the density of the pattern on the layout region on the basis of the density distribution function; the fifth step of increasing, when the index is not an allowable value, the size of that portion of the pattern which is located on one of the sub layout regions, thereby updating the density distribution function; and the sixth step of repeating the fourth and fifth steps until the index assumes the allowable value.

Preferably, in the third step, the sub layout regions are sequentially scanned through a plurality of different routes, thereby obtaining a plurality of density distribution functions concerning the pattern.

The pattern density of the scanned region of each sub layout region is defined by, for example, a value obtained by dividing, by the size of the sub layout region, the size of that portion of the pattern which is in the scanned region.

In the fourth step, the index is defined by, for example, a frequency component of a maximum amplitude included in non-zero frequency components which are indicated by a function obtained by subjecting the density distribution function to Fourier transform.

In the fifth step, the index of the unallowable value is defined by, for example, a value which is obtained by dividing the maximum amplitude by the amplitude of a zero frequency component.

The pattern is a wiring pattern, and increase of that portion of the pattern which is located on one of the sub layout regions indicates provision of dummy wiring, the dummy wiring thus being able to be designed to suppress dishing which may occur when an interlayer insulating film formed on the wiring pattern is mechanically and chemically polished to be flatten.

The dummy wiring is provided on a region obtained by subtracting a region corresponding to an initial density distribution function from a region corresponding to the density distribution function obtained in the fifth step.

A plurality of dummy arrangements wires are designed using the above method, and one of the thus-designed dummy wire arrangements which is compatible with other structural elements of a semiconductor device is actually used.

In the invention, the layout region is divided into a plurality of sub layout regions, and the density distribution function of the pattern is obtained by determining the density of that portion of the pattern which is located in each sub layout region. Accordingly, an index indicative of variations in pattern density can be obtained by mathematically analyzing the density distribution function.

If the index is an unallowable value, the size of that portion of the pattern which is located in one of the sub layout regions is increased to thereby update the density distribution function. This updating operation is continued until the index assumes an allowable value.

The region in which the dummy pattern is formed is obtained by subtracting a pattern formation region corresponding to an initial density distribution function from a pattern formation region corresponding to the density distribution function obtained in the fifth step. Thus, the dummy pattern formation region can be automatically determined.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 7 is a sectional view, showing a state in which the surface of an interlayer insulating film is uneven because of its underlayer wiring;

FIGS. 8A and 8B are sectional views, useful in explaining dishing which will occur during CMP; and FIGS. 9A and 9B are sectional views, useful in explaining a method for suppressing occurrence of dishing using dummy wiring.

DETAILED DESCRIPTION OF THE INVENTION

The embodiment of the invention will be described with reference to the accompanying drawings. As described in the section of prior art, the phenomenon of dishing occurs when there are variations in the density of wiring under the interlayer insulating film. From this, it is assumed that no dishing occurs if the wiring is uniformly distributed over the chip. The present invention has been developed in light of this fact.

Figure 1A:
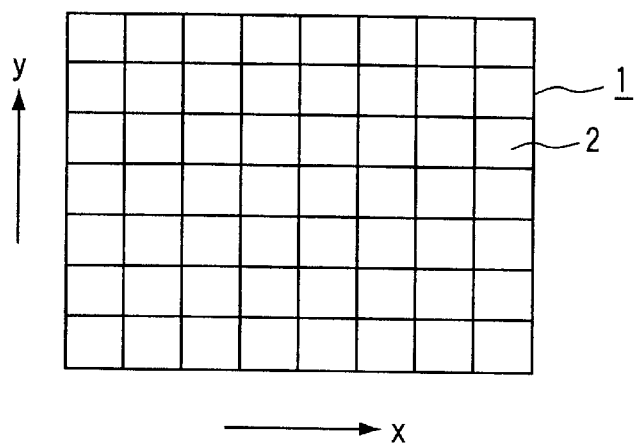
FIGS. 1A–1C are top views, useful in explaining a method of designing dummy wiring according to an embodiment of the invention.
Figure 1B:
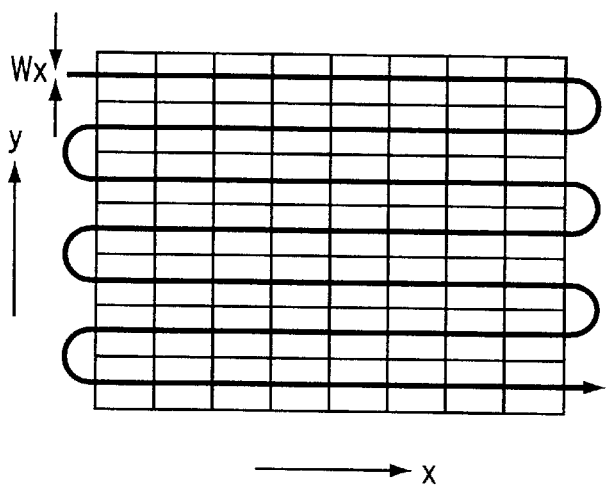
Figure 1C:
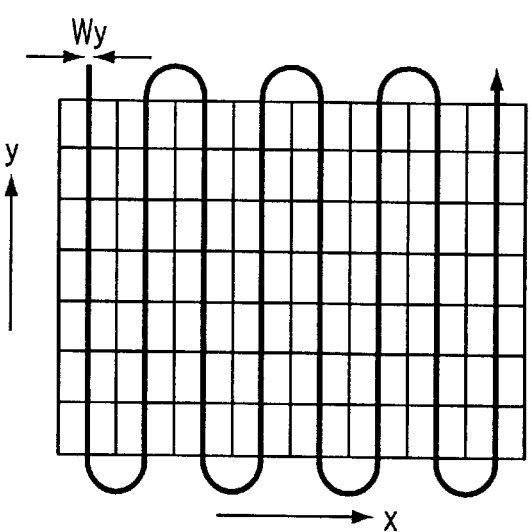
Figure 2:
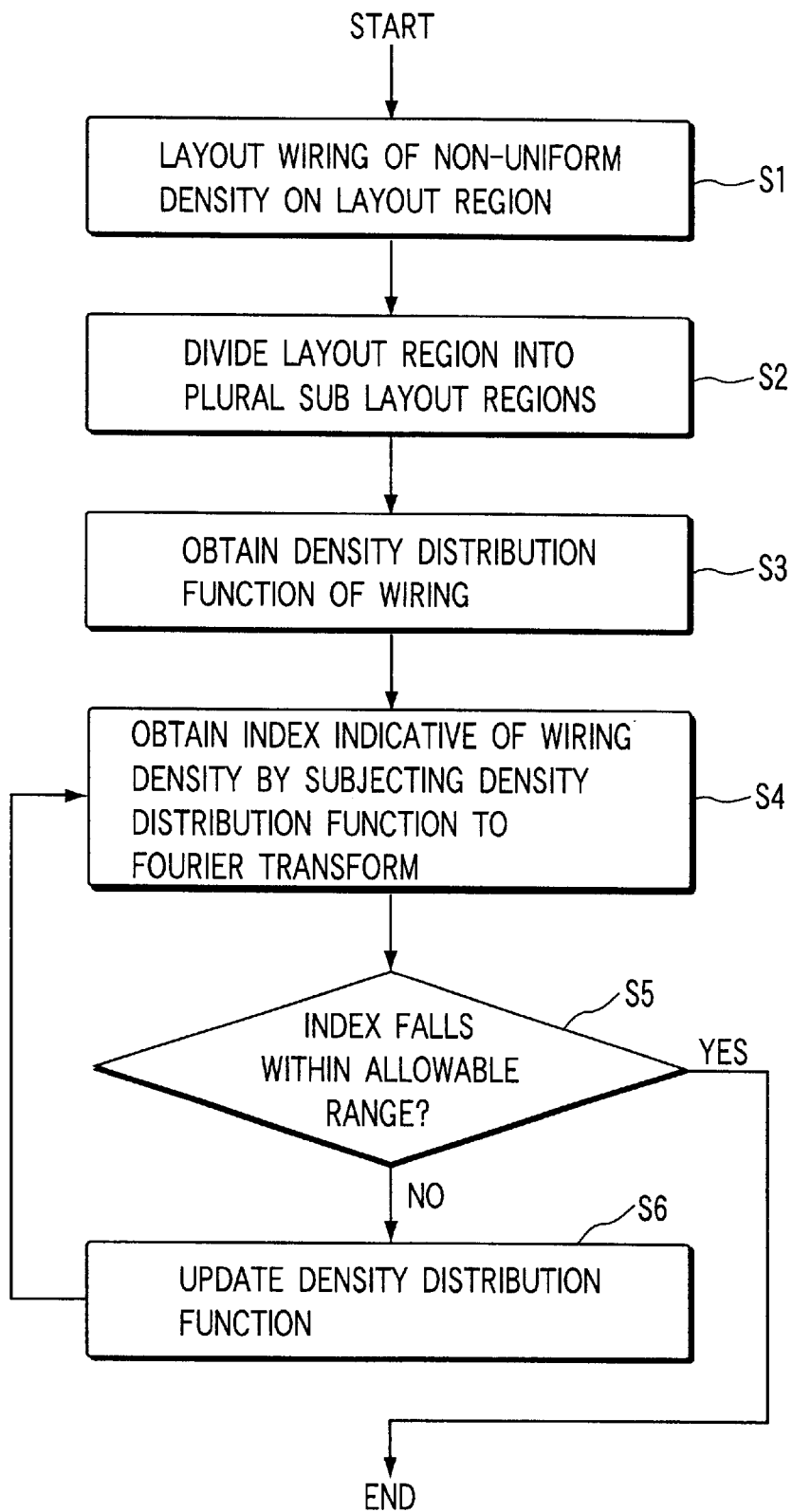
FIG. 2 is a flowchart, useful in explaining the method of designing dummy wiring according to the embodiment of the invention.

FIGS. 1A–1C are top views, useful in explaining a method of designing dummy wiring according to an embodiment of the invention. FIG. 2 is a flowchart, useful in explaining the method.

In this embodiment, first, wiring whose density is not uniform (not shown) is laid out on a chip 1 as shown in FIG. 1A (step S1).

Subsequently, the chip 1 is divided into sub chips 2 arranged in a matrix as shown in FIG. 1A. It is necessary to set the size of each sub chip 2 at not more than ¼ of the entire size of the chip 1. For example, the size of each sub chip 2 is 100 $\mu$m×100 $\mu$m (step S2).

After that, an X-directional certain width region Wx of each sub chip 2 is scanned as shown in FIG. 2B, whereby the size of wiring which exists in the scanned region of each sub chip 2 is calculated, and the density distribution function Dx(x) of wiring in the X direction is calculated (step S3). The density distribution function Dx(x) indicates (the size of wiring existing in the scanned region of each sub chip 2)/(the size of the sub chip 2).

Thereafter, a Y-directional certain width region Wy of each sub chip 2 is scanned as shown in FIG. 2C, whereby the size of wiring which exists in the scanned region of each sub chip 2 is calculated, and the density distribution function Dy(y) of wiring in the Y direction is calculated (step S3). The density distribution function Dy(y) indicates (the size of wiring existing in the scanned region of each sub chip 2)/(the size of the sub chip 2).

Figure 3A:
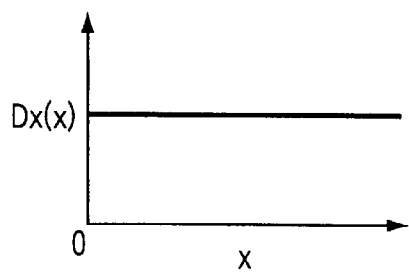
FIGS. 3A and 3B are graphs, showing examples of density distribution functions $Dx(x)$ and $Dy(y)$, respectively.
Figure 3B:
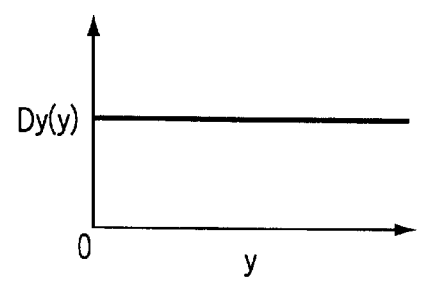

FIGS. 3A and 3B show examples of the density distribution functions Dx(x) and Dy(y), respectively. These examples indicate a case where the wiring density is uniform over the entire chip 1.

After that, the density distribution functions Dx(x) and Dy(y) are subjected to Fourier transform, and variation indexes indicative of the wiring density are obtained on the basis of the density distribution functions Dx(x) and Dy(y) subjected to Fourier transform (step S4).

Figure 4A:
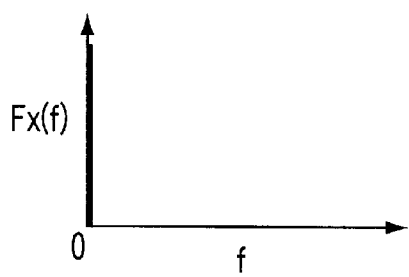
FIGS. 4A and 4B are graphs, showing functions $Fx(f)$ and $Fy(f)$ obtained by subjecting the density distribution functions $Dx(x)$ and $Dy(y)$ of FIGS. 3A and 3B to Fourier transform, respectively.
Figure 4B:
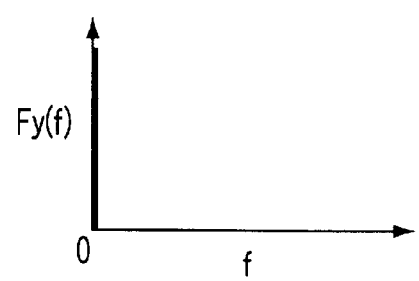

FIGS. 4A and 4B show functions Fx(f) and Fy(f) obtained by subjecting the density distribution functions Dx(x) and Dy(y) to Fourier transform, respectively. As is evident from the figures, the functions Fx(f) and Fy(f) are impulse functions.

Figure 5A:
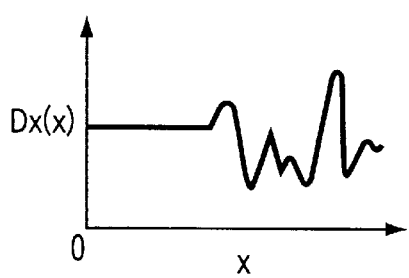
FIGS. 5A and 5B are graphs, showing other examples of density distribution functions $Dx(x)$ and $Dy(y)$, respectively.
Figure 5B:
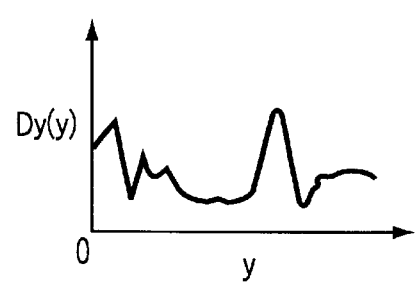

FIGS. 5A and 5B show other examples of the density distribution functions Dx(x) and Dy(y), respectively. These examples indicate a case where the wiring density is not uniform.

Figure 6A:
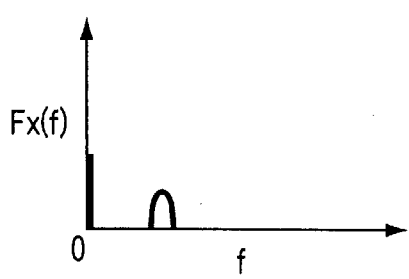
FIGS. 6A and 6B are graphs, showing functions $Fx(f)$ and $Fy(f)$ obtained by subjecting the density distribution functions $Dx(x)$ and $Dy(y)$ of FIGS. 5A and 5B to Fourier transform, respectively.
Figure 6B:
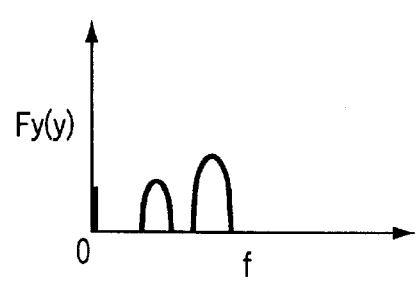

FIGS. 6A and 6B show functions Fx(f) and Fy(f) obtained by subjecting the density distribution functions Dx(x) and Dy(y) of FIG. 5A and 5B to Fourier transform, respectively. As is understood from these figures, the functions Fx(f) and Fy(f) have positive values even when f is not 0.

The frequency components other than 0 are due to variations in wiring density and will cause dishing during CMP.

In light of the above, the determination as to whether or not dishing will occur at the wiring can be done from the determination, for example, as to whether or not the ratios of Fx(f≠0) and Fy(f≠0) (which have positive values when the frequency components are other than 0) to Fx(f=0) and Fy(f=0), i.e. the indexes indicative of variations in wiring density, are lower than respective predetermined values.

For example, if 100·Fx(f≠0)/Fx(f=0) and 100·Fy(f≠0)/Fy (f=0) are less than 10%, it is determined that no dishing will occur.

Using the above-described determination method, it is determined whether or not the indexes indicative of variations in wiring density fall within allowable ranges, i.e. whether or not dishing will occur (step S5). If it is determined that no dishing will occur, designing of wiring is finished.

If, on the other hand, it is determined that dishing will occur, the size of wiring in a certain sub chip is increased, thereby forming new density distribution functions Dx(x) and Dy(y) to update the previous density distribution functions Dx(x) and Dy(y) (step S6).

To increase the size of wiring in a certain sub chip means to form dummy wiring therein.

Thereafter, the updated density distribution functions Dx(x) and Dy(y) are subjected to Fourier transform, thereby obtaining new functions Fx(f) and Fy(f) (i.e. new indexes) (step S4).

Using the above-described determination method, it is again determined whether or not dishing will occur (step S5).

If it is determined that no dishing will occur, designing of wiring is finished.

If, on the other hand, it is determined that dishing will occur, the steps S4–S6 are repeated until it is determined that no more dishing will occur.

The region in which dummy wiring is formed is obtained by subtracting a wiring forming region corresponding to the first density distribution functions Dx(x) and Dy(y) from a wiring forming region corresponding to the last density distribution functions Dx(x) and Dy(y).

Actually, a plurality of combinations of density distribution functions Dx(x) and Dy(y), to which regions with no dishing correspond, are calculated to obtain a plurality of regions for forming dummy wiring therein. Then, that one of the dummy wiring formation regions is selected, which is compatible with, for example, an integrated circuit incorporated in the actual device. If there are some regions which are compatible with it, one of the regions in which dummy wiring can be formed easiest is selected.

In the above designing method, the dummy wiring formation region can automatically be determined by repeated re-definition of the density distribution functions Dx(x) and Dy(y) and re-estimation of the functions Fx(f) and Fy(f), using a computer.

Thus, the present invention can design wiring free from dishing in a short time. Accordingly, the designing method of the invention is suitable to a semiconductor device which is required to be produced in a short time, such as an ASIC (Application Specific Integrated Circuit).

The invention is not limited to the above-described embodiment. In the case of multi-layer wiring, for example, it suffices if dummy wiring is designed for each layer in accordance with the designing method according to the embodiment. Moreover, although the embodiment is directed to the prevention of dishing, the invention can be also applicable to the prevention of micro loading. It is a matter of course that the invention can be modified in various manners without departing from its scope.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of designing dummy wiring comprising:

the first step of laying out a pattern of a non-uniform density on a layout region;

the second step of dividing the layout region into a plurality of sub layout regions, each of the sub layout regions having a size which is ¼ or less of the size of the layout region;

the third step of sequentially scanning the sub layout regions, obtaining the pattern density of the scanned region of each sub layout region, thereby obtaining a density distribution function concerning the pattern;

the fourth step of obtaining an index indicative of variations in the density of the pattern on the layout region on the basis of the density distribution function;

the fifth step of increasing, when the index is not an allowable value, the size of that portion of the pattern which is located on one of the sub layout regions, thereby updating the density distribution function; and the sixth step of repeating the fourth and fifth steps until the index assumes the allowable value; and wherein in the fifth step, the index of the unallowable value is defined by a value which is obtained by dividing the maximum amplitude by the amplitude of a zero frequency component.

2. A method of designing dummy wiring according to claim 1, wherein in the third step, the sub layout regions are sequentially scanned through a plurality of different routes, thereby obtaining a plurality of density distribution functions concerning the pattern.

3. A method of designing dummy wiring according to claim 1, wherein the pattern density of the scanned region of each sub layout region is defined by a value obtained by dividing, by the size of the sub layout region, the size of that portion of the pattern which is in the scanned region.

4. A method of designing dummy wiring according to claim 1, wherein in the fourth step, the index is defined by a frequency component of a maximum amplitude included in non-zero frequency components which are indicated by a function obtained by subjecting the density distribution function to Fourier transform.

5. A method of designing dummy wiring according to claim 1, wherein the pattern is a wiring pattern, and increase of that portion of the pattern which is located on one of the sub layout regions indicates provision of dummy wiring, the dummy wiring being designed to suppress dishing which may occur when an interlayer insulating film formed on the wiring pattern is mechanically and chemically polished to be flatten.

6. A method of designing dummy wiring according to claim 5, wherein the dummy wiring is compatible with other structural elements included in a semiconductor device.

7. A method of designing dummy wiring according to claim 5, wherein the dummy wiring is provided on a region obtained by subtracting a region corresponding to an initial density distribution function from a region corresponding to the density distribution function obtained in the fifth step.

* * * * *